United States Patent
Stelzl et al.

(10) Patent No.: US 6,519,822 B1
(45) Date of Patent: Feb. 18, 2003

(54) METHOD FOR PRODUCING AN ELECTRONIC COMPONENT

(75) Inventors: Alois Stelzl, München (DE); Hans Krüger, München (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 09/699,321

(22) Filed: Oct. 30, 2000

Related U.S. Application Data

(63) Continuation of application No. PCT/DE99/00895, filed on Mar. 25, 2000.

(30) Foreign Application Priority Data

Apr. 27, 1998 (DE) .......................................... 198 18 824

(51) Int. Cl.[7] ............................................. H04R 17/00
(52) U.S. Cl. .................... 29/25.35; 29/832; 29/841; 29/855; 29/856; 216/2; 216/17; 216/27; 216/49; 216/51; 264/272.11; 264/272.16
(58) Field of Search ................... 29/25.35, 832, 29/841, 855, 856; 264/272.11, 272.16; 216/2, 17, 27, 49, 51

(56) References Cited

U.S. PATENT DOCUMENTS

| | | | | |
|---|---|---|---|---|
| 5,045,820 A | * | 9/1991 | Leicht et al. ............... 333/26 |
| 5,252,882 A | * | 10/1993 | Yatsuda ................. 310/313 R |
| 5,390,401 A | * | 2/1995 | Shikata et al. ............. 29/25.35 |
| 5,431,771 A | * | 7/1995 | Vinouze et al. ............... 216/23 |
| 5,458,254 A | * | 10/1995 | Miyagawa et al. ........... 216/27 |
| 5,459,368 A | * | 10/1995 | Onishi et al. ........... 310/313 R |
| 5,471,722 A | * | 12/1995 | Yatsuda ..................... 29/25.35 |
| 5,508,558 A | * | 4/1996 | Robinette et al. ........... 257/700 |
| 5,573,171 A | * | 11/1996 | Kong et al. ............. 228/123.1 |
| 5,640,746 A | * | 6/1997 | Knecht et al. ............. 29/25.35 |
| 5,892,417 A | * | 4/1999 | Johnson et al. ............. 333/193 |
| 5,998,859 A | * | 12/1999 | Griswold et al. ........... 257/679 |
| 6,078,229 A | * | 6/2000 | Funada et al. ............. 333/193 |
| 6,117,347 A | * | 9/2000 | Ishida ........................ 216/52 |
| 6,136,175 A | * | 10/2000 | Stelzl et al. ................ 205/220 |
| 6,154,940 A | * | 12/2000 | Onishi et al. ............. 29/25.35 |
| 6,271,598 B1 | * | 8/2001 | Vindasius et al. .......... 257/777 |

FOREIGN PATENT DOCUMENTS

| | | |
|---|---|---|
| DE | 195 07 124 A1 | 9/1995 |
| DE | 195 48 048 A1 | 6/1997 |
| DE | 196 23 826 A1 | 12/1997 |
| DE | 198 06 550 A1 | 9/1999 |

OTHER PUBLICATIONS

Published International Application No. WO 97/45955 (Stelzl et al.), dated Dec. 4, 1997;.

* cited by examiner

*Primary Examiner*—Peter Vo
*Assistant Examiner*—Paul Kim
(74) *Attorney, Agent, or Firm*—Laurence A. Greenberg; Werner H. Stemer; Gregory L. Mayback

(57) ABSTRACT

A method for producing an electronic component includes placing an enclosed frame on a baseplate. A chip is provided to be fitted within the frame, forming a first given space between the chip and the baseplate and forming a second given space between the chip and the frame. The first given space is enclosed in a hermetically sealed manner by pressing a film onto the chip, except on a surface of the chip facing the baseplate, such that the film surrounds the chip and at least reaches the surface of the baseplate. The second given space is filled with a casting compound. The film is then removed at surface regions of the film being free of the casting compound. Finally, a cover composed of an electrically conductive material is applied on the chip, the casting compound and the frame.

5 Claims, 2 Drawing Sheets

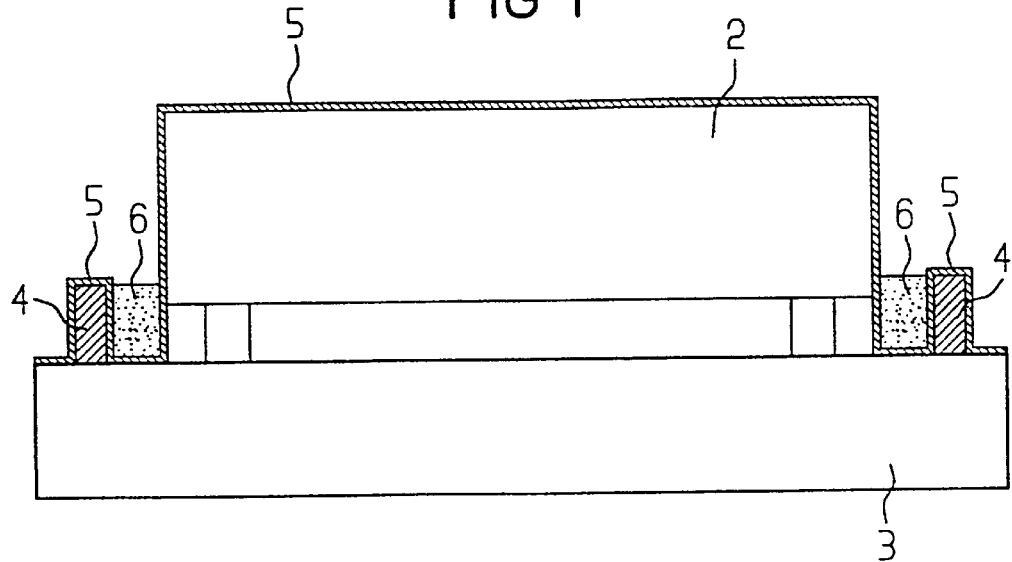
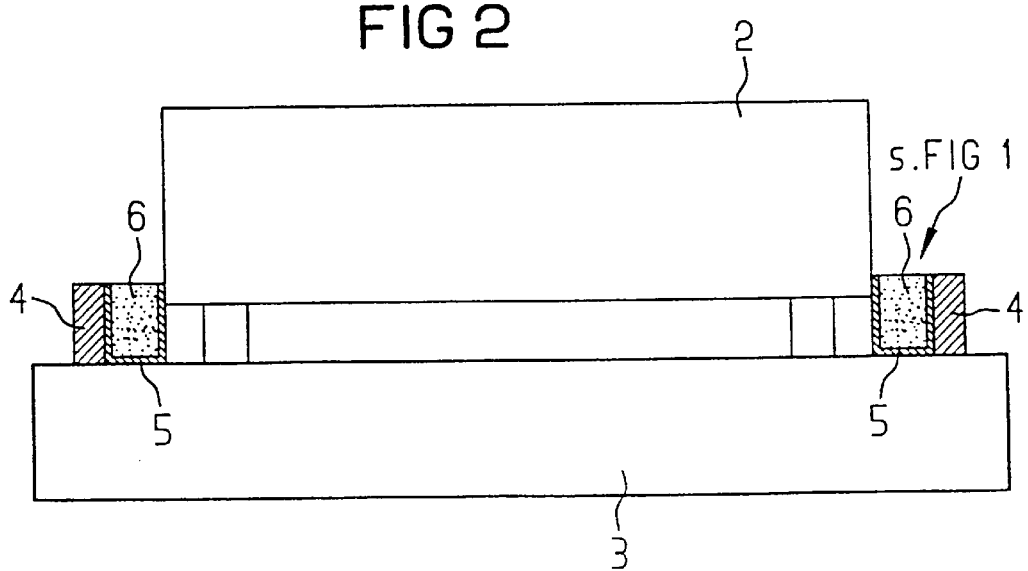

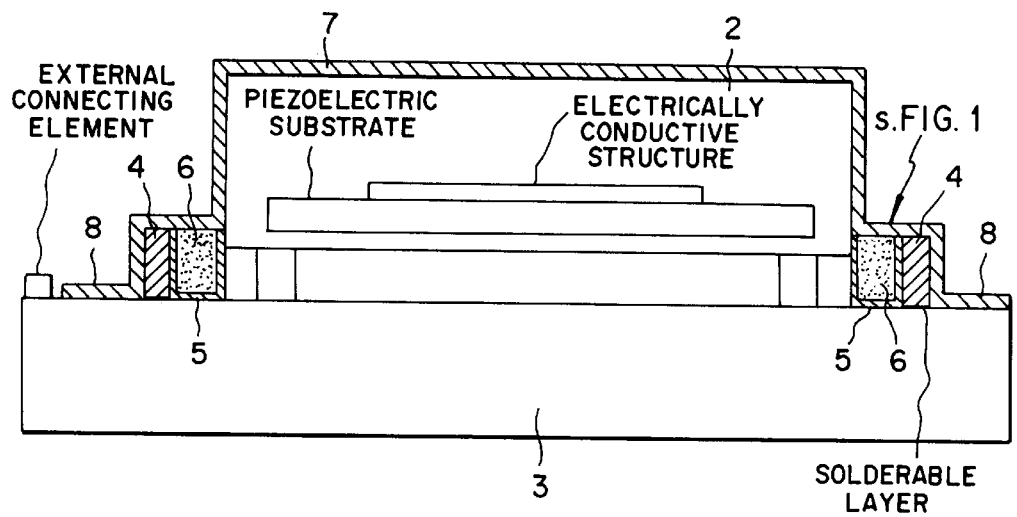

METHOD FOR PRODUCING AN ELECTRONIC COMPONENT

CROSS-REFERENCE TO RELATED APPLICATION

This application is a continuation of copending International Application No. PCT/DE99/00895, filed Mar. 25, 2000, which designated the United States.

BACKGROUND OF THE INVENTION

1. Field of the Invention

The invention relates to an electronic component and to a method of producing such a component. In particular, the invention relates to a surface acoustic wave component (SAW component) which operates with surface acoustic waves.

The SAW component has a chip with a piezoelectric substrate, with electrically conductive structures, such as interdigital transducers, interconnects and the like, provided on the chip. The SAW component further has a baseplate with external connecting elements which make contact with the electrically conductive structures on the chip, and a hermetically sealed frame, which is provided on the baseplate and within which the chip is disposed, such that the chip is disposed at a distance from the frame.

Such components generally have a high level of miniaturization and have a protective film, which provides excellent protection against physical and chemical environmental influences. However, such components require a complicated and expensive manufacturing process.

SUMMARY OF THE INVENTION

It is accordingly an object of the invention to provide an electronic component, in particular an SAW component, which overcomes the above-mentioned disadvantages of the heretofore-known components of this general type and which can be further miniaturized and which can be manufactured with a simple process at low costs. It is a further object of the invention to provide a method of producing an electronic component, such as an SAW component, which is less complex than conventional methods, while at the same time reduces the production costs.

With the foregoing and other objects in view there is provided, in accordance with the invention, an electronic component, including:

a baseplate having external connecting elements;

a chip disposed on the baseplate such that a first given space is defined between the chip and the baseplate;

the chip including a piezoelectric substrate;

electrically conductive structures being provided on the chip;

the external connecting elements electrically contacting the electrically conductive structures on the chip;

a solder frame disposed directly on the baseplate;

the chip being disposed, in accordance with a flip-chip technique, within the solder frame and spaced at a distance from the solder frame;

a film enclosing and sealing off the first given space between the chip and the baseplate, the film extending to the baseplate and defining a second given space between the solder frame and the film;

a casting compound filling the second given space between the film and the solder frame;

a cover formed of an electrically conductive material and having an edge region, the cover being applied over the chip, the casting compound and the solder frame; and the edge region of the cover resting on the baseplate and forming a seal.

In other words, in order to achieve the object of the invention, it is suggested that the space between the chip and the baseplate is surrounded by a film, for example a plastic film, which forms a seal; that the space between the frame and the film is filled with the film and/or with a casting compound, for example epoxy resin; and that the chip together with the casting compound and the frame is protected by a cover composed of electrically conductive material, for example a copper nickel alloy, whose edge region rests on the baseplate, such that it forms a seal.

In accordance with another feature of the invention, wall surfaces and bottom surfaces bound a given space between the solder frame, the baseplate and the chip; and the film covers the wall surfaces and the bottom surfaces.

In accordance with yet another feature of the invention, a solderable layer is applied to the baseplate; and the solder frame is composed of a solderable material and is soldered to the solderable layer.

In accordance with a further feature of the invention, the cover is composed of a copper nickel alloy.

In accordance with yet a further feature of the invention, the casting compound is an epoxy resin.

In accordance with another feature of the invention, the film is a plastic film.

With the objects of the invention in view there is also provided, a method for producing an electronic component, which includes the steps of:

providing a chip fitted within a frame on a baseplate;

enclosing a first given space between the chip and the baseplate in a hermetically sealed manner by pressing a film onto the chip, except on a side surface of the chip facing the baseplate, such that the film extends at least as far as the baseplate;

filling a second given space between the frame and the film with a casting compound;

removing the film at surface regions of the film being free of the casting compound; and applying a cover composed of an electrically conductive material on the chip, the casting compound and the frame.

In other words, the method according to the invention proposes that the chip—except for the side surface facing the baseplate—has a film, which extends down at least as far as the baseplate, pressed around it, that the space between the frame and the film is filled with a casting compound, that the film is removed in its surface regions which are free of casting compound, for example by a plasma etching and that a covering composed of electrically conductive material is applied on the chip and on the casting compound.

In accordance with another mode of the invention, the enclosing step includes cladding, with the film, wall surfaces and top surfaces bounding a given space between the frame, the baseplate and the chip.

In accordance with yet another mode of the invention, the removing step is performed with a plasma etching process.

In accordance with a further mode of the invention, the applying step includes applying, as the cover, a protective cap composed of a copper nickel alloy.

In accordance with yet a further mode of the invention, a large-area baseplate, which has a plurality of chips disposed thereon in rows, is used.

Dispensing with the protective film considerably reduces costs, and reduces the dimensions of the components. In addition, the component according to the invention is distinguished by its increased reliability since, when it is being soldered onto the baseplate, which is done using flip-chip technology, there is no risk that solder balls or bumps, which are liquid in this state, will flow into free spaces or gaps, which are present during a so-called underfilling of the component with casting compound, for example epoxy resin. Such a risk also does not exist when the component is being soldered into the respective customer circuit.

Other features which are considered as characteristic for the invention are set forth in the appended claims.

Although the invention is illustrated and described herein as embodied in an electronic component and a method of producing the electronic component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1 to 3 are schematic sectional views of the electronic component according to the invention at different stages during its production.

DESCRIPTION OF THE PREFERRED EMBODIMENTS

In order to better explain the invention, reference is made to Published, Non-Prosecuted German Patent Application DE 198 06 550 A1, which proposes, for an electronic component of the type mentioned above, that a structured protective film, also referred to as PROTEC by the applicant, is applied to the chip surface on which the electrically conductive structures are located. The protective film has electrical contact elements on its surface facing away from the piezoelectric substrate. The contact elements are connected both, via through-contacts in the protective film and/or via solder balls or bumps to the electrically conductive structures on the chip and to the external connecting elements on the baseplate.

For manufacturing the components as a mass-produced product, a substrate plate, in particular a ceramic plate, is provided, which can be separated into baseplates 3, is fitted with conductor tracks and is fitted with frames 4, which are provided in rows on the substrate plate. The frames are so-called solder frames, which are each intrinsically closed and within which, at a distance from the frames, the electrically conductive structures on chips 2 are in each case soldered onto corresponding conductor tracks on the baseplate using a flip-chip technology.

In a first step according to the invention, the chips 2, which have been soldered on in this way, have—except for the side surface facing the baseplate 3—a plastic film 5, or a metal or composite sheet, pressed around them, which extends at least as far as the baseplate 3. However, in this case—as the figures show—the film 5 is preferably provided over the entire surface of the baseplate 3 and of the solder frame 4 in the space between the solder frame 4 and the chip 2. It is possible, if this is advantageous for production reasons, for the film 5 to completely enclose the solder frame 4 as well, and for its ends to rest on the baseplate 3.

In a further method step, the space between the solder frame 4 and the film 5 is filled, as far as necessary, with a casting compound 6, in particular epoxy resin, the film 5 is then removed by plasma etching in its surface regions which are free of casting compound and, finally, a covering 7 which acts as a protective cap and is composed of electrically conductive material is applied to the chip 2, the casting compound 6 and the frame 4. By way of example, a covering 7 composed of a copper nickel alloy is suitable for this purpose, whose edge region 8 is soldered in a hermetically sealing manner, for example to a layer which is deposited by sputtering on the baseplate 3 and in consequence can be soldered.

FIGS. 1 to 3 show the individual manufacturing steps on the basis of just one SAW component. As is normal in mass production and has already been mentioned, the manufacturing process is based on relatively large-area baseplates or blanks with a large number of chips which are provided in rows and are each surrounded by frames, in particular solder frames.

We claim:

1. A method for producing an electronic component, the method which comprises:

disposing an enclosed frame on a baseplate;

providing a chip fitted within the frame, forming a first given space between the chip and the baseplate and forming a second given space between the chip and the frame;

enclosing the first given space in a hermetically sealed manner by pressing a film onto the chip, except on a surface of the chip facing the baseplate, such that the film surrounds the chip and at least reaches the surface of the baseplate;

filling the second given space with a casting compound;

removing the film at surface regions of the film being free of the casting compound; and applying a cover composed of an electrically conductive material on the chip, the casting compound and the frame.

2. The method according to claim 1, wherein the enclosing step includes cladding, with the film, wall surfaces and top surfaces of the frame, the baseplate and the chip bounding the second given space.

3. The method according to claim 1, wherein the removing step is performed with a plasma etching process.

4. The method according to claim 1, wherein the applying step includes applying, as the cover, a protective cap composed of a copper nickel alloy.

5. The method according to claim 1, which comprises using, as the baseplate, a large-area baseplate having a plurality of chips disposed thereon in rows.

* * * * *